Feb. 15, 1955 WEN YUAN PAN 2,702,373

DOUBLE TUNED FILTER STRUCTURE

Filed June 5, 1951

INVENTOR
WEN YUAN PAN
BY H. W. Newton
ATTORNEY

United States Patent Office 2,702,373

Patented Feb. 15, 1955

2,702,373

DOUBLE TUNED FILTER STRUCTURE

Wen Yuan Pan, Collingswood, N. J., assignor to Radio Corporation of America, a corporation of Delaware Application June 5, 1951, Serial No. 230,043

9 Claims. (Cl. 333—73)

This invention relates generally to filter structures for high-frequency signals, and particularly relates to a resonant structure suitable as a signal band pass filter and tunable over a portion of the ultra high frequency (UHF) range.

Recently the UHF band from 500 to 890 megacycles (mc.) has been tentatively allocated for broadcasting television images. Tunable circuit structures in accordance with the invention are particularly adapted for tuning receivers to a selected television station broadcasting within the new UHF band. It will be appreciated that a tunable circuit for use within the new UHF television band cannot consist of lumped circuit elements because the frequency of the carrier waves is too high. On the other hand, the frequency of a carrier wave within this new UHF range is so low that resonant structures such as a resonant cavity or a wave guide, which are conventionally utilized in the upper UHF band cannot conveniently be used. It is well known that resonant structures such as cavities and wave guides are particularly useful at frequencies of 3000 mc. and higher.

For any broadcast receiver adapted to receive signals within the new UHF television band a tunable band pass filter is required which may be provided between the antenna and the first radio frequency amplifier or if no radio frequency amplifier is provided, between the antenna and the mixer stage. Such a band pass filter structure should have a high Q even at high frequencies where Q indicates a figure of merit which is sometimes called the magnification factor and which may be defined as the ratio of the energy stored by the resonant circuit or structure over the energy dissipated. Such a band pass filter structure should also have a constant band width over its tuning range. Since the band width depends essentially on the coupling factor, the structure should have a constant coupling factor over the tuning range. The band pass filter should also have a sharp cut-off outside of the pass band to minimize various spurious responses. For use in a broadcast receiver, ease of manufacture and low cost are also imporatnt considerations.

It is, accordingly, an object of the present invention to provide a resonant filter structure tunable over a wide portion of the frequency range between approximately 50 and approximately 1000 mc. to provide a signal pass band of predetermined and constant width.

A further object of the invention is to provide a filter structure equivalent to two resonant circuits and having a uniform coefficient of coupling and hence a constant band width throughout its tuning range.

Another object of the invention is to provide a tunable filter structure of the character referred to which combines high Q with ease of manufacture and simplicity of alignment and which can be readily adapted for mass production at a low cost.

The UHF filter structure of the invention comprises two resonant circuit structures which may be identical to each other. Each of the circuit structures includes two conductive capacitance members which are spaced and electrically insulated from each other, and two conductors connected individually to the capacitance members. Each of the conductors represents an inductance. A tuning element such as a metallic core is associated with the capacitance members to provide a capacitance between each of the members and the tuning element. The tuning element is movable with respect to the capacitance members so that at least one of the capacitances is varied upon relative movement of the tuning element.

The two circuit structures are disposed adjacent to each other so that they are electrostatically and electromagnetically coupled to each other. The free ends of the conductors are connected together and may be grounded. A pair of input terminals may be coupled between one conductor of one circuit structure and ground, while a pair of output terminals is coupled between one conductor of the other circuit structure and ground.

It has been found that such a filter structure may have an initial Q of approximately 250 and a tuning range up to and over 3 to 1. The coupling and consequently the band width of the filter structure is constant over its tuning range.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
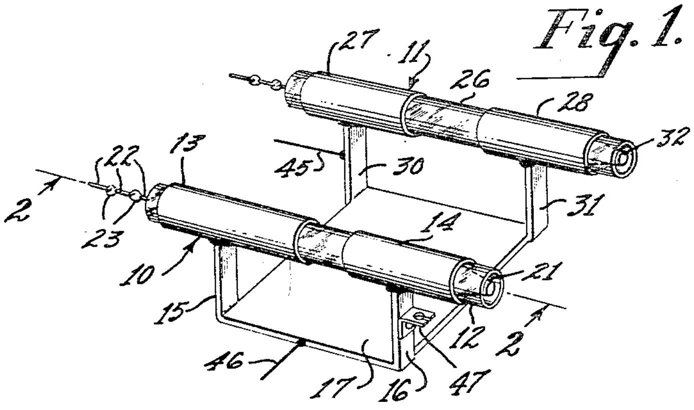
Figure 1 is a view in perspective of a filter structure embodying the present invention.
Figure 2:
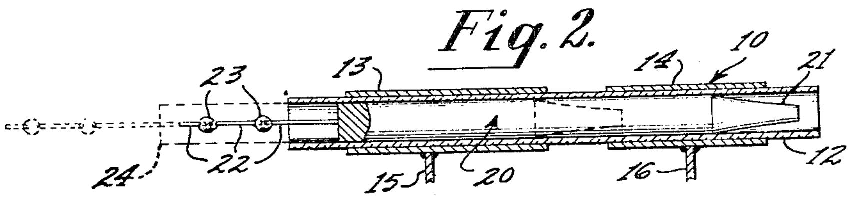
Figure 2 is a sectional view of the structure of Figure 1 taken on line 2—2 of Figure 1.

Referring now to the drawing and particularly to Figures 1 and 2, there is illustrated a filter structure which comprises two resonant circuit structures 10 and 11 which may be identical. The circuit structure 10 includes a hollow cylinder or tube 12 consisting of a material having a high dielectric constant such, for example, as a ceramic material or glass. Preferably tube 12 consists of glass which may readily be manufactured with a high dielectric constant and with a wall thickness which can be maintained within close tolerances in mass production.

A pair of conductive capacitive members 13 and 14 is provided on the outside of glass tubing 12. The capacitive members 13, 14 consist of a conductor such, for example, as copper or silver and may be coated to provide sleeves disposed about the circumference of the glass tubing 12. A pair of conductors 15 and 16 is electrically connected to each of the coatings 13, 14. The conductors may, for example, consist of a suitable metal such as copper or brass or they may be silver plated.

Preferably, the free ends of conductors 15, 16 are connected together. This may be effected by providing a metallic plate 17 with which the conductors 15, 16 may be integral. Thus, the metallic plate 17 may be formed with conductors 15, 16 which may be turned upward to provide leg portions 15, 16 extending at right angles with respect to the plate 17.

A movable conductive tuning element 20 (see Figure 2) cooperates with the capacitance members or coatings 13, 14. As shown in the drawing, the tuning element may take the form of a metallic core 20 which has one extreme position where it extends within both coatings 13, 14. The tuning core 20 may be provided with a tapered end portion 21 to provide a predetermined relationship between the movement of the tuning core 20 and the resulting variation of the resonant frequency of the resonant filter structure. The tuning core 20 may be moved by means of wires 22 which are electrically insulated from each other by glass beads 23 in the manner disclosed and claimed in the copending application of T. Murakami, filed February 2, 1950, Serial No. 142,013 and assigned to the assignee of this application. The tuning core 20 may be moved into its first extreme position shown in full lines and into a second extreme position 24 shown in dotted lines.

It will, accordingly, be seen that the capacitance between coating 14 and core 20 varies upon movement of the tuning core. On the other hand, the capacitance provided between coating 13 and core 20 remains substantially constant upon movement of the tuning core.

The second resonant circuit structure 11 includes a tube 26 consisting again of a material having a high dielectric constant and provided with two metallic coatings 27 and 28. A pair of conductors 30, 31 is connected individually to the two coatings 27, 28. The conductors 30, 31 may consist of another pair of leg portions which are formed integral with the plate 17 and form a right angle therewith. A tuning core 32 may be provided within tube 26.

The operation of the filter structure of Figures 1 and 2 may best be explained by reference to the equivalent circuit of Figure 3. The two resonant circuits are again indicated by the numerals 10 and 11. The resonant circuit 11 includes an inductor 35, a variable capacitor 36, a fixed capacitor 37 and an inductor 38 connected in series. The first inductor 35 represents the inductance of conductor 30. The capacitors 36, 37 indicate respectively the capacitance between core 32 and coatings 27, 28 while the inductor 38 represents the inductance of conductor 31.

Similarly, the second resonant circuit 10 comprises an inductor 40, a variable capacitor 41, a second capacitor 42 and an inductor 43 which are also connected in series. The inductance of inductor 40 is represented by conductor 15. Capacitors 41 and 42 represent respectively the capacitance between coating 13 and core 20 and between core 20 and coating 14. Finally, inductor 43 represents the inductance of conductor 16. Circuits 10 and 11 are series resonant circuits.

An input circuit which may, for example, be the antenna is coupled between the leg portion or conductor 30 and plate 17. For the purpose of matching the impedance of the input circuit to that of the circuit structure 11, an intermediate point of conductor 30 may be connected to one input terminal 45 indicated by a wire, while the plate 17 may be grounded.

The output circuit which may, for example, be the mixer stage or the first radio frequency amplifier is also connected between the conductor or leg portion 16 and the plate 17. Again in order to match impedances, an intermediate point of conductor 16 may be connected to the terminal element 47 while the second terminal is formed by the lead 46 which may be connected to ground. The terminal element 47 is arranged to receive a crystal rectifier which may serve as the mixer stage.

Figure 3:
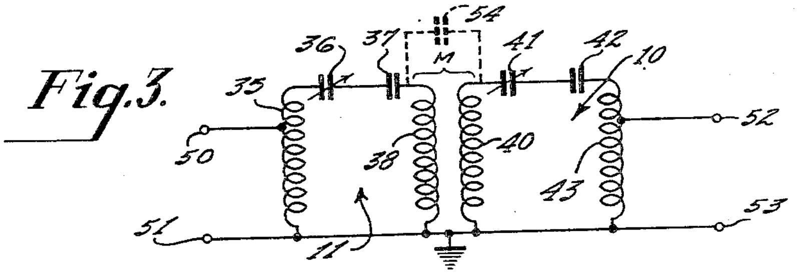
Figure 3 is an equivalent circuit diagram of the filter structure of Figure 1.

In the equivalent circuit of Figure 3 a pair of input terminals 50, 51 may be connected respectively to an intermediate point of inductor 35 and to ground. A pair of output terminals 52, 53 may be connected between an intermediate point of inductor 43 and ground.

The two resonant circuits or circuit structures 10 and 11 are electromagnetically and electrostatically coupled to each other as indicated in Figure 3 by the letter M and by the dotted capacitor 54. The electromagnetic coupling coefficient is determined primarily by the distance between the resonant circuit structures 10 and 11. This distance, of course, is determined by the distance between the first pair of conductors 15, 16 and the second pair 30, 31. The electrostatic coupling coefficient is determined primarily by the diameter of the tubes 12 and 26, and also by the separation between the tubes. If the resonant filter structure of the invention is surrounded by an electrostatic shield, this will also have an effect on the electrostatic coupling coefficient.

The electromagnetic coupling is stronger at the low frequency end of the tuning range, while the electrostatic coupling is stronger at the high frequency end of the tuning range. Consequently, the coefficient of coupling is substantially uniform throughout the entire tuning range. The tuning range may be as large as 3 to 1 and is adjustable by selecting the dielectric constant of the tubes 12, 26, the wall thickness of the tubes and the air gap between the coatings 13, 14 and its associated core 20, for example. The filter structure of the invention will operate over a portion of the frequency range from approximately 50 to approximately 1000 mc.

Figure 4:
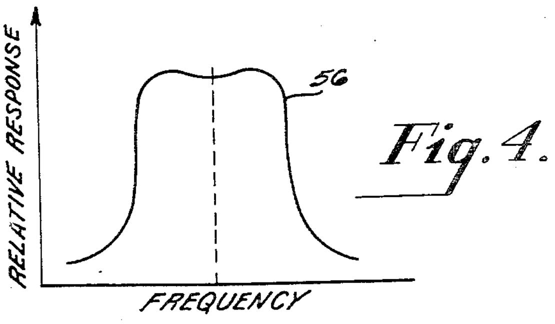
Figure 4 is a graph illustrating the relative response of the filter structure of Figure 1 as a function of frequency.

It has been found that the unloaded Q of the filter structure of the invention is approximately 250 which is reduced by the load represented by the input and output circuits to approximately 50. The relative response of the filter structure of the invention as a function of frequency as is shown at 56 in Figure 4. It will be seen that the attenuation outside of the pass band of the filter is comparatively high.

The coatings 13, 14 and 27, 28 may, for example, consist of copper or copper and silver. The end portion 21 of the core 20 is tapered to facilitate tracking of the filter structure of the invention with the local oscillator in a superheterodyne receiver and to provide for a substantially linear relationship between the movement of the cores and the resulting frequency of the pass band of the filter.

As clearly shown in Figure 3, each of the resonant circuits 10 and 11 is a series resonant circuit including two constant inductors and one variable capacitor in addition to a fixed capacitor. The inductance values of the conductors 15, 16 and 30, 31 essentially determine the frequency range over which the circuits are tuned. The conductors 15, 16, 30, 31 are of constant predetermined length. The minimum value of the capacitance of each of the series resonant circuits 10 and 11 may be made smaller than 1 micromicrofarad, which permits a large ratio of inductance to capacitance.

The plate 17 may, for example, consist of copper having a thickness of 50 mils. The legs 15, 16 may have a distance of 1¼ inches while the legs 16, 31 may be spaced approximately 1⅜ inches between their midpoints. The distance between the lower edge of tube 12 and plate 17 may be approximately ⅞ inch. A filter structure with these dimensions may be tuned from 500 to 890 mc.

There has thus been disclosed a UHF filter structure consisting of two series resonant circuit structures which have uniform coupling over the tuning range. Consequently, the width of the pass band of the filter structure remains constant over the tuning range which may be as large as 3 to 1. The circuit structure is simple to adjust and to align and has a high Q even at the high frequency end of the tuning range; it is well adapted for mass production and may be manufactured at a low cost.

What is claimed is:

1. A UHF filter structure comprising two resonant circuit structures, each of said structures including two conductive capacitance members spaced and electrically insulated from each other, two conductors connected individually to said members, each of said conductors representing an inductance, a conductive tuning element adjacent to said members to provide a capacitance between each of said members and said tuning element, said tuning element being movable with respect to said members and electrically insulated therefrom to vary at least one of said capacitances upon relative movement of said tuning element; said circuit structures being disposed adjacent to each other, thereby to provide electrostatic and electromagnetic coupling between said circuit structures, a common conductive connection between the free ends of said conductors and means providing input and output terminal connections to the conductors of said resonant circuit structures.

2. A UHF filter structure comprising two resonant circuit structures, each including two metallic capacitance members spaced and electrically insulated from each other, a conductor connected to each of said members, each of said conductors representing an inductance, a conductive tuning element coaxial with said members to provide a capacitance between each of said members and said tuning element, said tuning element being movable with respect to said members and electrically insulated therefrom to vary one of said capacitances upon relative movement of said tuning element: said circuit structures being disposed adjacent to each other to provide electrostatic and electromagnetic coupling therebetween, a common conductive connection between the free ends of said conductors, and a pair of terminals coupled between one of the conductors and its associated member of each of said circuit structures and said common connection.

3. A UHF filter structure comprising two resonant circuit structures, each including two metallic capacitance members spaced and electrically insulated from each other, a conductor connected to each of said members, each of said conductors representing an inductance, a metallic core coaxial with said members to provide a capacitance between each of said members and said core, said core being movable with respect to said members and electrically insulated therefrom to vary one of said capacitances while maintaining the other capacitance constant upon relative movement of said core; the members and conductors of one of said circuit structures being disposed adjacent and substantially parallel to the members and conductors of the other one of said circuit structures, thereby to provide close electrostatic and electromagnetic coupling between said circuit structures, a common conductive connection between the free ends of said conductors, and a pair of terminals coupled between an intermediate point of one of the conductors of each of said circuit structures and said common connection.

4. A UHF filter structure comprising two resonant circuit structures, each of said structures including a tube of a material having a high dielectric constant, a pair of conductive coatings provided on the outside of said tube and spaced from each other, a pair of conductors, each being connected to one of said coatings and representing an inductance, a core assembly slideable in said tube and cooperating with said coatings to provide individual capacitances between each coating and said core assembly, said core assembly being shaped to vary the capacitance formed between said core assembly and at least one of its associated coatings upon relative movement of said core assembly; said two circuit structures being disposed adjacent to each other to provide electromagnetic and electrostatic coupling therebetween, a common conductive connection between the free ends of said conductors, and means providing input and output terminal connections for each of said resonant circuit structures.

5. A UHF filter structure comprising two resonant circuit structures, each including a tube of a material having a high dielectric constant, a pair of metallic coatings provided on the outside of said tube and spaced from each other, a pair of conductors, each being connected to one of said coatings and representing an inductance, a metallic core assembly slideable in said tube and cooperating with said coatings to provide individual capacitances between each coating and said core assembly, said core assembly having one end portion shaped to vary the capacitance formed between said end portion and its associated coating upon relative movement of said core assembly; said two circuit structures being disposed adjacent to each other to provide electromagnetic and electrostatic coupling between each other, a common conductive connection between the free ends of said conductors, input terminals coupled between said conductive connection and one of the conductors of one of said circuit structures, and output terminals coupled between said conductive connection and one of the conductors of the other one of said circuit structures.

6. A UHF filter structure comprising two resonant circuit structures, each including a tube of a material having a high dielectric constant, a pair of metallic coatings provided on the outside of said tube and spaced from each other, a pair of conductors extending away from said tube and disposed substantially parallel to each other, each being connected to one of said coatings and representing an inductance, a core assembly slideable in said tube and cooperating with said coatings to provide individual capacitances between each coating and said core assembly, said core assembly having one end portion tapered to vary the capacitance formed between said end portion and its associated coating upon relative movement of said core assembly; the tube and conductors of one of said two circuit structures being disposed adjacent and substantially parallel to the tube and conductors of the other one of said circuit structures, thereby to provide close electromagnetic and electrostatic coupling between said two circuit structures, a common conductive connection between the free ends of said conductors, a pair of input terminals connected individually to said conductive connection and to an intermediate point of one of the conductors of one of said circuit structures, and a pair of output terminals connected individually to said conductive connection and to an intermediate point of one of the conductors of the other one of said circuit structures.

7. A UHF filter structure comprising a first and a second resonant circuit structure identical with each other, each including a tube of a material having a high dielectric constant, a pair of metallic coatings provided on the outside of said tube and spaced from each other, a core assembly slideable in said tube and cooperating with said coatings to provide individual capacitances between each coating and said core assembly, said core assembly being shaped to vary the capacitance provided between said core assembly and at least one of its associated coatings upon relative movement of said core assembly; a metallic plate having four upturned leg portions, a first pair of said leg portions being connected individually to the coatings of said first circuit structure, the second pair of said leg portions being connected individually to the coatings of said second circuit structure, whereby said two circuit structures are electromagnetically and electrostatically coupled to each other, a pair of input terminals connected between said metallic plate and one of said first pair of said leg portions, and a pair of output terminals connected between said metallic plate and one of said second pair of said leg portions, whereby each of said circuit structures is equivalent to a series resonant circuit tunable over a predetermined frequency range with substantially constant coupling of said circuit structures over said predetermined frequency range.

8. A UHF filter structure comprising a first and a second resonant circuit structure identical with each other, each including a tube of a material having a high dielectric constant, a pair of metallic coatings provided on the outside of said tube and spaced from each other, a core assembly slideable in said tube and cooperating with said coatings to provide individual capacitances between each coating and said core assembly, said core assembly having one end portion tapered to vary the capacitance provided between said tapered end portion and its associated coating upon relative movement of said core assembly; a metallic plate having four upturned leg portions, a first pair of said leg portions being disposed substantially parallel to the second pair, said first pair of said leg portions being connected individually to the coatings of said first circuit structure, said second pair of said leg portions being connected individually to the coatings of said second circuit structure, whereby said tubes are disposed substantially parallel to each other and said two circuit structures are electromagnetically and electrostatically coupled to each other, a pair of input terminals connected between said metallic plate and one of said first pair of said leg portions, and a pair of output terminals connected between said metallic plate and said second pair of said leg portions, whereby each of said circuit structures is equivalent to a series resonant circuit tunable over a predetermined frequency range with substantially constant coupling of said circuit structures over said predetermined frequency range.

9. A UHF filter structure comprising a first and a second resonant circuit structure identical with each other, each including a tube of a material having a high dielectric constant, a pair of metallic coatings provided on the outside of said tube and spaced from each other, a core assembly slideable in said tube and cooperating with said coatings to provide individual capacitances between each coating and said core assembly, said core assembly having one end portion tapered to vary the capacitance provided between said tapered end portion and its associated coating upon relative movement of said core assembly; a metallic plate having four upturned leg portions extending substantially at right angles to said plate and parallel to each other, a first pair of said leg portions being connected individually to the coatings of said first circuit structure, the second pair of said leg portions being connected individually to the coatings of said second circuit structure, whereby said two circuit structures are electromagnetically and electrostatically coupled to each other, a pair of input terminals connected between said metallic plate and an intermediate point of one of said first pair of said leg portions, and a pair of output terminals connected between said metallic plate and an intermediate point of one of said second pair of said leg portions, whereby each of said circuit structures is equivalent to a series resonant circuit tunable over a predetermined frequency range with substantially constant coupling of said circuit structures over said predetermined frequency range.

References Cited in the file of this patent

UNITED STATES PATENTS

| | | |
|---|---|---|
| 2,259,003 | Reid | Oct. 14, 1941 |
| 2,370,714 | Carlson | Mar. 6, 1945 |
| 2,440,269 | Hargrove | Apr. 27, 1948 |
| 2,514,337 | Reid | July 4, 1950 |
| 2,527,608 | Willoughby | Oct. 31, 1950 |
| 2,543,891 | Carlson | Mar. 6, 1951 |
| 2,577,511 | Cohn | Dec. 4, 1951 |